(12) United States Patent
Chagam Reddy

(10) Patent No.: US 10,468,077 B2
(45) Date of Patent: Nov. 5, 2019

(54) ADAPTIVE OBJECT BUFFERING AND META-DATA INDEXING USING PERSISTENT MEMORY TO IMPROVE FLASH MEMORY DURABILITY IN TIERED STORAGE

(71) Applicant: Intel Corporation, Santa Clara, CA (US)

(72) Inventor: Anjaneya R. Chagam Reddy, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/891,148

(22) Filed: Feb. 7, 2018

(65) Prior Publication Data

US 2019/0043540 A1  Feb. 7, 2019

(51) Int. Cl.
*G06F 3/06* (2006.01)
*G11C 7/10* (2006.01)
*G06F 12/08* (2016.01)

(52) U.S. Cl.
CPC ............. *G11C 7/10* (2013.01); *G06F 3/061* (2013.01); *G06F 3/064* (2013.01); *G06F 3/0679* (2013.01); *G06F 12/08* (2013.01)

(58) Field of Classification Search
CPC ........ G06F 3/064; G06F 3/061; G06F 3/0679; G06F 3/06; G11C 7/10

USPC ..................................................... 711/102, 5
See application file for complete search history.

(56) References Cited

U.S. PATENT DOCUMENTS

| 7,958,255 | B1* | 6/2011 | Karighattam | H04L 49/9057 709/232 |
| 10,013,177 | B2* | 7/2018 | Liu | G06F 3/061 |
| 2015/0235699 | A1* | 8/2015 | Wells | G11C 5/02 365/51 |
| 2017/0123995 | A1* | 5/2017 | Freyensee | G06F 12/10 |
| 2018/0081591 | A1* | 3/2018 | Maheshwari | G06F 3/0656 |
| 2018/0089088 | A1* | 3/2018 | Jakowski | G06F 11/1469 |

* cited by examiner

*Primary Examiner* — Pierre Miche Bataille
(74) *Attorney, Agent, or Firm* — Compass IP Law, PC

(57) ABSTRACT

Examples include techniques for storing an object in a non-volatile memory in a solid-state storage device (SSD), the SDD supporting input/output (I/O) operations of a block size, when a size of the object is greater than or equal to the block size. The object may be stored in a write buffer in a persistent memory in a computing platform when the size of the object is less than the block size. An object metadata component may be updated in the persistent memory to store attributes of stored objects, the attributes comprising at least an object identifier, an object state, and a location where the object is stored, the location being one or more of a cache in volatile memory, the write buffer, and the SSD. A flush operation may be performed to coalesce objects smaller than the block size together in the write buffer and to store the coalesced objects in the SSD when a size of coalesced objects is equal to the block size.

20 Claims, 10 Drawing Sheets

ADAPTIVE OBJECT BUFFERING AND META-DATA INDEXING USING PERSISTENT MEMORY TO IMPROVE FLASH MEMORY DURABILITY IN TIERED STORAGE

TECHNICAL FIELD

Examples described herein are generally related to techniques for improving performance of computing systems using non-volatile memory.

BACKGROUND

A multi-level cell (MLC) is a memory element capable of storing more than a single bit of information, compared to a single-level cell (SLC) which can store only one bit per memory element. Triple-level cells (TLC) and quad-level cells (QLC) are versions of MLC memory, which can store 3 and 4 bits per cell, respectively. (Note that due to convention, the name "multi-level cell" is sometimes used specifically to refer to the "two-level cell"). Overall, memories are commonly referred to as SLC (1 bit per cell—fastest, highest cost); MLC (2 bits per cell); TLC (3 bits per cell); and QLC (4 bits per cell—slowest, least cost).

One example of a MLC memory is QLC NAND flash memory. High density QLC NAND flash memory provides excellent read throughput, but write throughput lags behind significantly and provides limited endurance, which is measured in Drive Writes Per Day (DWPD). Since QLC NAND flash memory requires the writing of a whole block of memory at a time, if there is only a small change in stored data (such as any amount smaller than the block size) unnecessary write cycles are typically performed during write operations. NAND Pages cannot be overwritten and the only way to reclaim individual pages is to move used pages in a NAND block to new block and erase whole NAND block at once. This is triggered automatically by the garbage collection process in the flash controller. Furthermore, every cell in a NAND die has a limited number of write cycles before the cell becomes unreliable and unusable. In some NAND flash memories, a measurement of the endurance is only 0.3 DWPD. This may be unacceptable in some scenarios, such as in servers.

DETAILED DESCRIPTION

Figure 1:
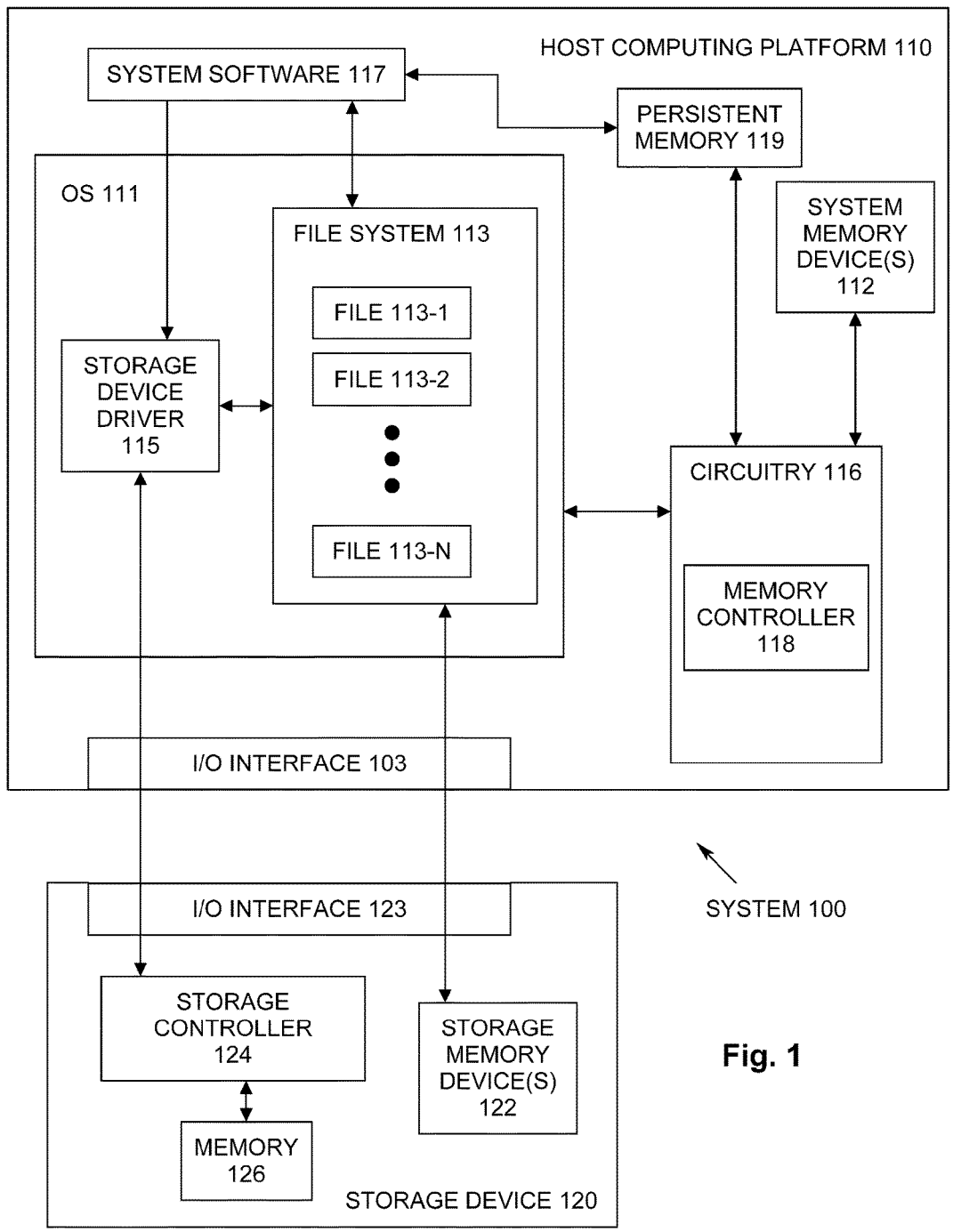
FIG. 1 illustrates an example first system.

Some computing platforms implementations apply Log Structured Merge (LSM) tree algorithms to take advantage of drive write sequential input/output (I/O) bandwidth. However, LSM tree algorithms are not suited for Non-Volatile Memory Express (NVMe) solid-state drives (SSDs) because they incur significant compute overhead due to background compactions, and result in inefficient use of SSD I/O bandwidth. NVMe SSDs may be implemented according to the Non-Volatile Memory Express (NVMe) Specification, revision 1.2, published in November 2014 ("NVMe specification") or later revisions. LSM tree algorithms have been optimized for hard disk drives (HDDs), which have low throughput compared to NVMe SSDs. As the storage capacity of NVMe SSDs increases, application of LSM tree algorithms becomes so slow and disruptive to system performance as to become unworkable in modern servers.

As contemplated in the present disclosure, a persistent, non-volatile memory, such as a three-dimensional crosspoint memory (e.g., a 3D XPoint™ memory commercially available from Intel Corporation), may be used as a persistent buffering, meta-data indexing tier to deliver improved system performance while achieving maximal storage capacity using an SSD having QLC NAND flash memory. In embodiments, metadata for storage objects and associated write buffers may be stored in persistent memory to speed up writes and object lookups. A background flush operation may be used to pack objects into I/O units of block size and may use SSD sequential I/O write bandwidth to store the I/O units, thereby delivering better performance and improving SSD endurance.

In embodiments, object metadata describing a storage object may be stored in persistent memory. Object metadata may comprise a unique key (also called a name), object state, data integrity (e.g., object hash), security (e.g. cryptographic key), and object locations. An object may have one or more fragments, and may be smaller than, equal to, or larger than the block size. Objects smaller than a block size may reside in a read cache (such as a volatile memory such as a form of dynamic random-access memory (DRAM)), a three-dimensional cross-point persistent memory (e.g., a 3D XPoint™ memory commercially available from Intel Corporation), or an SSD, or any combination of the three. In embodiments, small objects may get buffered in persistent memory (e.g., objects smaller than the block size). They may be grouped into storage bins of a certain size to avoid fragmentation when they are packed and flushed to the SSD. Large objects (e.g., objects larger than the block size) get written directly to the SSD since write operations to store the large objects can use the sequential I/O bandwidth capabilities of the SSD. A drive free block meta-data information represented using bin, hash or tree data structures. A free chunk tree data structure may be maintained in persistent memory for faster SSD space allocations and de-allocations. Small objects may share SSD blocks and they may get promoted to persistent memory when any of them get deleted. Embodiments of the present invention combine the best of 3D XPoint™ dual inline memory module (DIMM) and QLC NAND media SSD capabilities to deliver high throughput storage object I/O performance for system workloads. The efficient use of system resources according to embodiments of the present invention provide for improved performance even as the density of flash memories increases. Embodiments of the present invention result in fewer writes to the SSD, and eliminate the compaction process used in LSM implementations completely, thereby maximizing drive throughput and improving system reliability.

FIG. 1 illustrates an example first system 100. In some examples, as shown in FIG. 1, system 100 includes a host computing platform 110 coupled to one or more storage device(s) 120 through I/O interface 103 and I/O interface 123. Also, as shown in FIG. 1, host computing platform 110 may include an OS 111, one or more system memory device(s) 112, circuitry 116 and system software 117. For these examples, circuitry 116 may be capable of executing various functional elements of host computing platform 110 such as OS 111 and system software 117 that may be maintained, at least in part, within system memory device(s) 112. Circuitry 116 may include host processing circuitry to include one or more central processing units (CPUs) (not shown) and associated chipsets and/or controllers.

According to some examples, as shown in FIG. 1, OS 111 may include a file system 113 and a storage device driver 115 and storage device 120 may include a storage controller 124, one or more storage memory device(s) 122 and memory 126. OS 111 may be arranged to implement storage device driver 115 to coordinate at least temporary storage of data for a file from among files 113-1 to 113-n, where "n" is any whole positive integer>1, to storage memory device(s) 122. The data, for example, may have originated from or may be associated with executing at least portions of system software 117 and/or OS 111, or application programs (not shown in FIG. 1). As described in more detail below, OS 111 communicates one or more commands and transactions with storage device 120 to write data to storage device 120. The commands and transactions may be organized and processed by logic and/or features at the storage device 120 to write the data to storage device 120.

In some examples, storage controller 124 may include logic and/or features to receive a write transaction request to storage memory device(s) 122 at storage device 120. For these examples, the write transaction may be initiated by or sourced from system software 117 that may, in some embodiments, utilize file system 113 to write data to storage device 120 through input/output (I/O) interfaces 103 and 123.

In some examples, memory 126 may include volatile types of memory including, but not limited to, RAM, D-RAM, DDR SDRAM, SRAM, T-RAM or Z-RAM. One example of volatile memory includes DRAM, or some variant such as SDRAM. A memory subsystem as described herein may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), and/or others, and technologies based on derivatives or extensions of such specifications.

However, examples are not limited in this manner, and in some instances, memory 126 may include non-volatile types of memory, whose state is determinate even if power is interrupted to memory 126. In some examples, memory 126 may include non-volatile types of memory that is a block addressable, such as for NAND or NOR technologies. Thus, memory 126 can also include a future generation of types of non-volatile memory, such as a 3-dimensional cross-point memory (3D XPoint™), or other byte addressable non-volatile types of memory. According to some examples, memory 126 may include types of non-volatile memory that includes chalcogenide glass, multi-threshold level NAND flash memory, NOR flash memory, single or multi-level Phase Change Memory (PCM), a resistive memory, nanowire memory, FeTRAM, MRAM that incorporates memristor technology, or STT-MRAM, or a combination of any of the above, or other memory.

In some examples, storage memory device(s) 122 may be a device to store data from write transactions and/or write operations. Storage memory device(s) 122 may include one or more chips or dies having gates that may individually include one or more types of non-volatile memory to include, but not limited to, NAND flash memory, NOR flash memory, 3-D cross-point memory (3D XPoint™), ferroelectric memory, SONOS memory, ferroelectric polymer memory, FeTRAM, FeRAM, ovonic memory, nanowire, EEPROM, phase change memory, memristors or STT-MRAM. For these examples, storage device 120 may be arranged or configured as a solid-state drive (SSD). The data may be read and written in blocks and a mapping or location information for the blocks may be kept in memory 126.

According to some examples, communications between storage device driver 115 and storage controller 124 for data stored in storage memory devices(s) 122 and accessed via files 113-1 to 113-n may be routed through I/O interface 103 and I/O interface 123. I/O interfaces 103 and 123 may be arranged as a Serial Advanced Technology Attachment (SATA) interface to couple elements of host computing platform 110 to storage device 120. In another example, I/O interfaces 103 and 123 may be arranged as a Serial Attached Small Computer System Interface (SCSI) (or simply SAS) interface to couple elements of host computing platform 110 to storage device 120. In another example, I/O interfaces 103 and 123 may be arranged as a Peripheral Component Interconnect Express (PCIe) interface to couple elements of host computing platform 110 to storage device 120. In another example, I/O interfaces 103 and 123 may be arranged as a Non-Volatile Memory Express (NVMe) interface to couple elements of host computing platform 110 to storage device 120. For this other example, communication protocols may be utilized to communicate through I/O interfaces 103 and 123 as described in industry standards or specifications (including progenies or variants) such as the Peripheral Component Interconnect (PCI) Express Base Specification, revision 3.1, published in November 2014 ("PCI Express specification" or "PCIe specification") or later revisions, and/or the Non-Volatile Memory Express (NVMe) Specification, revision 1.2, also published in November 2014 ("NVMe specification") or later revisions.

In some examples, system memory device(s) 112 may store information and commands which may be used by circuitry 116 for processing information. Also, as shown in FIG. 1, circuitry 116 may include a memory controller 118. Memory controller 118 may be arranged to control access to data at least temporarily stored at system memory device(s) 112 for eventual storage to storage memory device(s) 122 at storage device 120.

In some examples, storage device driver 115 may include logic and/or features to forward commands associated with one or more read or write transactions and/or read or write operations originating from system software 117. For example, the storage device driver 115 may forward commands associated with write transactions such that data may be caused to be stored to storage memory device(s) 122 at storage device 120. More specifically, storage device driver 115 can enable communication of the write operations from system software 117 at computing platform 110 to controller 124.

System Memory device(s) 112 may include one or more chips or dies having volatile types of memory such RAM, D-RAM, DDR SDRAM, SRAM, T-RAM or Z-RAM. However, examples are not limited in this manner, and in some instances, system memory device(s) 112 may include non-volatile types of memory, including, but not limited to, NAND flash memory, NOR flash memory, 3-D cross-point memory (3D XPoint™), ferroelectric memory, SONOS memory, ferroelectric polymer memory, FeTRAM, FeRAM, ovonic memory, nanowire, EEPROM, phase change memory, memristors or STT-MRAM.

Persistent memory 119 may include one or more chips or dies having non-volatile types of memory, including, but not limited to, NAND flash memory, NOR flash memory, 3-D cross-point memory (3D XPoint™), ferroelectric memory, SONOS memory, ferroelectric polymer memory, FeTRAM, FeRAM, ovonic memory, nanowire, EEPROM, phase change memory, memristors or STT-MRAM.

According to some examples, host computing platform 110 may include, but is not limited to, a server, a server array or server farm, a web server, a network server, an Internet server, a work station, a mini-computer, a main frame computer, a supercomputer, a network appliance, a web appliance, a distributed computing system, a personal computer, a tablet computer, a smart phone, multiprocessor systems, processor-based systems, or combination thereof.

Figure 2:
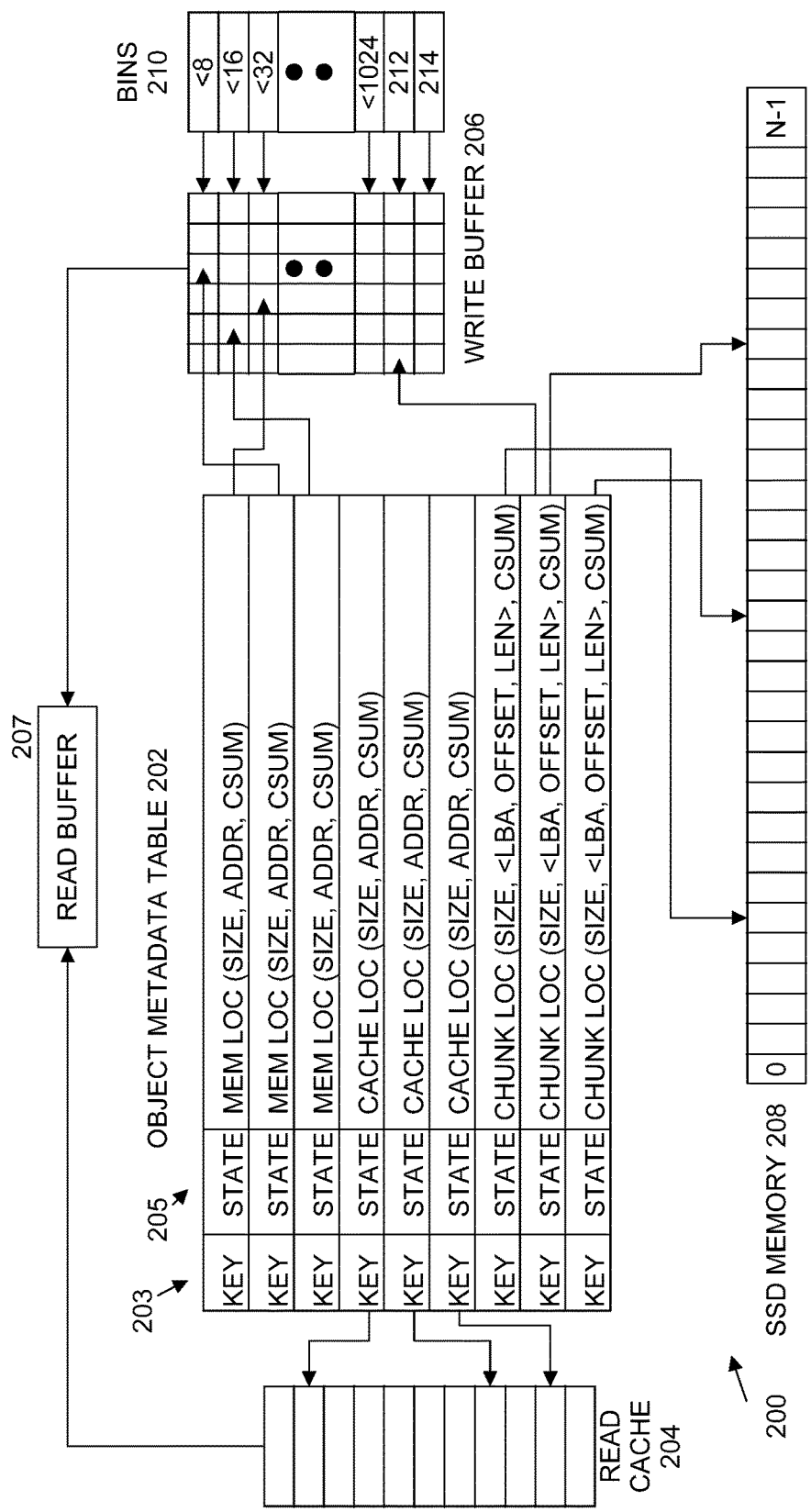
FIG. 2 illustrates an example second system.

FIG. 2 illustrates an example second system. In an embodiment, a component called an object metadata table 202 comprises a data structure to store metadata about storage objects in system 200. A storage object may be any set of data stored in system 100 in any format, such as a document, an audio file, video file, log file, text file, binary file, and so on. Although the data structure component to store object metadata is called a table herein, any suitable data structure or mechanism for storing data may be used (e.g., arrays, hashes, trees, lists, etc.). In embodiments of the present invention, at any given time a storage object may be stored in one or more locations in system 200, such as in read cache 204, write buffer 206, read buffer 207, and SSD memory 208. In an embodiment, read cache 204 may be a part of volatile system memory device(s) 112 of FIG. 1. Among the read cache 204, write buffer 206, read buffer 207, and SSD memory 208, read cache 204 has the fastest data access time. Read cache 204 may be used to temporarily store data most recently used by OS 111 or system software 117. In one example, read cache 204 may store approximately 1% to 2% of the data in current use by system 200. In an embodiment, write buffer 206 may be a part of persistent memory 119 of FIG. 1 (such as 3D XPoint™), and may also be known as a persistent write buffer. Write buffer 206 may have a slower access speed than read cache 204 in system memory device(s) 112. Write buffer 206 may be used to temporarily store data in system 200 prior to writing one or more objects to SSD memory 208. In an embodiment, the size of each data unit stored in the write buffer may be smaller than the block size of storage memory device(s) 122. In one example, write buffer may store approximately 8% to 9% of the data in current use by system 200. Read buffer 207 may temporarily store data read from read cache 204 or write buffer 206. In an embodiment, read buffer 207 may be a part of persistent memory 119 of FIG. 1 (such as 3D XPoint™). In an embodiment, SSD memory 208 may be a part of storage memory device(s) 122 of FIG. 1. SSD memory 208 may be used to store longer term data in system 200. SSD memory 208 may have a slower access speed than write buffer 206 in persistent memory 119. In one example, SSD memory 208 may store approximately 90% of the data in current use by system 200. SSD memory 208 may be addressed by a logical block address (LBA) within the SSD (such as storage device 120 of FIG. 1).

In embodiments of the present invention, if a request for a write is smaller than a block size of the SSD, the object to be stored in the SSD may be temporarily stored in write buffer 206. If the request for a write is at least as big as a block, then at least a block's worth of the object may be written to SSD memory 208. Leftover object portions may be stored in write buffer 206 for future coalescing with other objects to form a block.

A storage object may be referenced by object metadata table 202 comprising a key 203 and value attributes. A key may be used as an object identifier. Value attributes may be a binary blob and may contain any type of content that is relevant for a given workload. In embodiments of the present invention, a storage object workload may use several attributes associated with the object to identify contextual information regarding the object. For example, an attribute may be a current state 205 of the object. Object state 205 may be used to track whether there are any pending I/O operations in progress, so that additional I/O operations are not performed on the same object and the same time, and to ensure that data integrity is maintained. For example, an attribute may be the current location of where the object is stored, such as in read cache 204, write buffer 206, or SSD memory 208. For example, an attribute may include a checksum of the object. For example, an attribute may be a size of the object. For example, an attribute may be a creation date and time of an object (or a type of document, for example) which is stored within the object. Embodiments of the present invention treat the object's contents as well as the object's attributes as an opaque blob. In some embodiments it may be desired to keep the stored metadata as small as possible while achieving optimal system performance. In some embodiments it may be desired to keep a small portion of object attributes as part of object meta-data to speed up look ups (e.g., expired objects).

In an embodiment, a storage object may be split into two logical sections—the object metadata and the object's content (i.e., data). As shown in FIG. 2, each entry in object metadata table 202 comprises a <key, state, location> tuple that provides information regarding object state as well as a location of an object. An object can be located entirely in a persistent memory 119 (e.g., 3D Xpoint™), cached in system memory device(s) 112 (e.g., dynamic random access memory (DRAM)), or stored in storage memory device(s) 122 (e.g., NVMe SSD). In one example, a write buffer location may comprise a size, and address, and a checksum. In one example, a read cache location may comprise a size, and address, and a checksum. In one example, a SSD memory location may comrpise a size, a tuple of an LBA, an offset, and a length, and a checksum. In embodiments, both the object metadata table 202 as well as write buffer 206 may be stored in persistent memory 119. In one embodiment, object metadata table 202 may be stored in a hash table to speed up lookups in persistent memory 119. Only a small portion of the object (e.g., smaller than the block size of the SSD's I/O) will be stored in write buffer 206 and data may get flushed to SSD memory 208 when a sufficient number of objects can be coalesced into block sized groups. Large objects of at least block size (specified using configuration setting) may get directly written to SSD memory 208 as this can take advantage of SSD sequential IO bandwidth and reduce the amount of space needed for write buffer 206. An object may get divided into portions called "chunks" and spread across random locations inside SSD memory 208 based on currently available free blocks and fragementation inside the SSD memory. When an object is not aligned to the SSD's block size, a last object portion may be staged in write buffer 206 in order to achieve SSD space efficiency. This last object portion may get coalesced with other objects in write buffer 206 and eventually get flushed to SSD memory 208.

In embodiments, write buffer 206 may be designed to ensure optimal bin packing when the object(s) is flushed to the SSD. In one example, a block size of SSD memory 208 may be 4096 (4K) bytes. In one example, objects in write buffer 206 in persistent memory 119 may be mapped to one of the 2**n aligned bins 210 for objects less than 4096 bytes, where each bin 1 . . . n points to write buffer entries which store data of size $2^n$. The remaining objects may be mapped to either a 4K aligned bin 212 or a 4K unaligned bin 214. During the flush operation (as described below), embodiments of the present invention search for unaligned 4K chunks and tries to pair them up with the best fit object bin to achieve maximum space efficiency.

Figure 3:
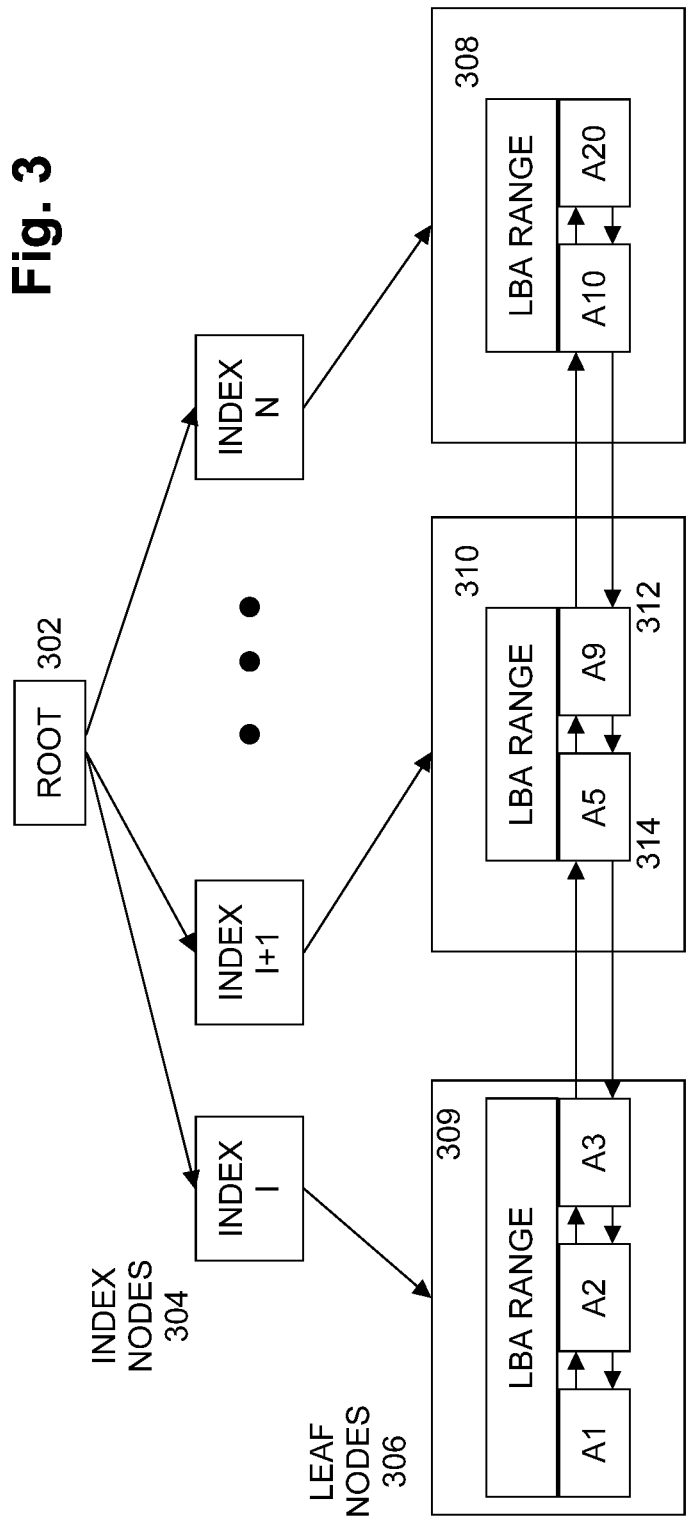
FIG. 3 illustrates an example free chunk data structure.

FIG. 3 illustrates an example component called a free chunk data structure 300. The free chunk data structure may be used to identify a largest contiguous amount of free space in the SSD for allocation of objects during a write operation. In an embodiment, a chunk may be a collection of free blocks in SSD memory 208. As shown in FIG. 3, in one example, a representation of LBA ranges for each chunk range is maintained in a tree data structure 300. In other examples, the free chunk data structure may comprise a list, a table, a hash, or other mechanism or format for storing data. Traversing the free chunk tree may begin at root node 302. Index nodes 304 (denoted Index I, Index I+1, . . . Index N) may indicate a sub-tree with leaf nodes having the same size free chunks. Leaf nodes 306 may be sorted in the tree such that a right child leaf node 308 may have larger sized free chunks than a left child leaf node 310. Embodiments of the present invention, in one example, may search for the largest number of free blocks (i.e., in one or more chunks) needed to perform a write operation by scanning the tree from the rightmost bottom leaf node 308 to the left 309. Leaf nodes 306 may contain a set of LBA ranges (for example, A1 to A2 and A2 to A3 in leaf node 309, A5 to A9 in leaf node 310, and A10 to A20 in leaf node 308) that have contiguous free blocks of a given size in the tree. In an embodiment, each leaf node 306 also maintains a maximum LBA 312 and a minimum LBA 314, which may be used to identify contiguous free space. Embodiments of the present invention may coalesce free chunks into bigger free chunks, and may store indications of the bigger free chunks in the free chunk data structure 300.

Figure 4:
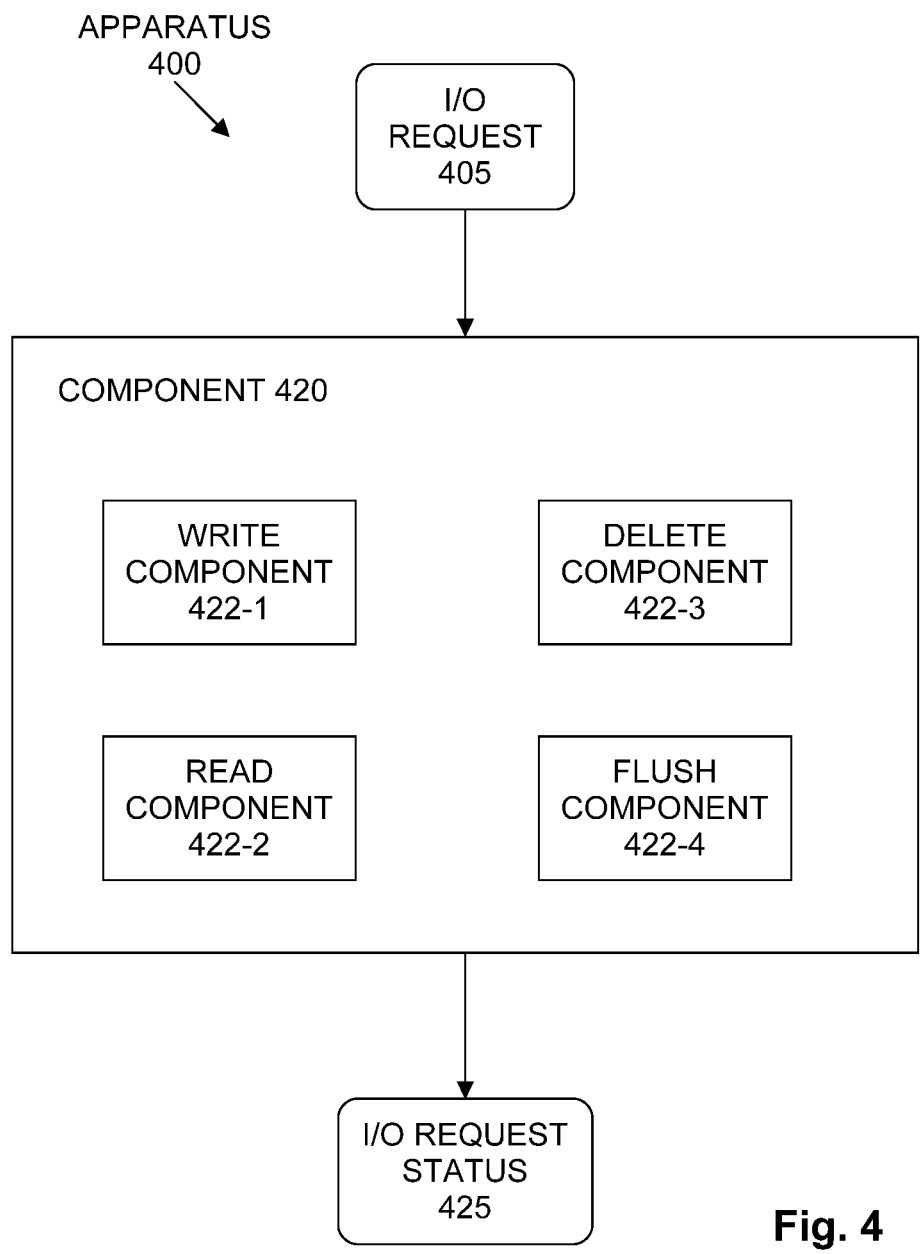
FIG. 4 illustrates an example block diagram for an apparatus.

FIG. 4 illustrates an example block diagram for an apparatus 400. Although apparatus 400 shown in FIG. 4 has a limited number of elements in a certain topology, it may be appreciated that the apparatus 400 may include more or less elements in alternate topologies as desired for a given implementation.

Apparatus 400 may be supported by component 420. In an embodiment, apparatus 400 may be implemented in system software 117 of system 100 shown in FIG. 1. In another embodiment, apparatus may be implemented in circuitry 116 of system 100 shown in FIG. 1. Component 420 may be arranged to execute one or more software or firmware implemented components or modules 422-a (e.g., implemented, at least in part, by system software 117 or alternatively circuitry 116). It is worthy to note that "a" and "b" and "c" and similar designators as used herein are intended to be variables representing any positive integer. Thus, for example, if an implementation sets a value for a=4, then a complete set of software or firmware for components or modules 422-a may include components 422-1, 422-2, 422-3, or 422-4. Also, these "components" may be software/firmware stored in computer-readable media, and although the components are shown in FIG. 4 as discrete boxes, this does not limit these components to storage in distinct computer-readable media components (e.g., a separate memory, etc.).

According to some examples, component 420 may include a processor or processor circuitry. The processor or processor circuitry can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. According to some examples component 420 may also include one or more application-specific integrated circuits (ASICs) and at least some components 422-a may be implemented as hardware elements of these ASICs.

According to some examples, apparatus 400 may include a write component 422-1. Write component 422-1 may be a logic and/or feature executed by component 420 to receive a write request as I/O request 405 for a write transaction to write one or more objects to SSD memory 208, and to implement the requested write. I/O request 405, for example, may have been sent from a caller, such as an application executing at host computing platform 110, system software 117, or OS 111. Once the write request is performed, component 420 may return an I/O request status 425 to the calling entity (e.g., an application executing at host computing platform 110, system software 117, or OS 111).

In some examples, apparatus 400 may also include a read component 422-2. Read component 422-2 may be a logic and/or feature executed by component 420 to receive a read request as I/O request 405 for a read transaction to read one or more objects from SSD memory 208, and to implement the requested read.

In some examples, apparatus 400 may also include a delete component 422-3. Delete component 422-3 may be a logic and/or feature executed by component 420 to receive a delete request as I/O request 405 for a delete transaction to delete one or more objects from write buffer 206 or SSD memory 208, and to implement the requested delete.

In some examples, apparatus 400 may also include a flush component 422-4. Flush component 422-4 may be a logic and/or feature executed by component 420 to receive a flush request as I/O request 405 for a flush transaction to flush out the write buffer 206 and store the contents into SSD memory 208, and to implement the requested flush.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 5, FIG. 6, FIG. 7, FIG. 8, and FIG. 9 illustrate an example of a logic flow 500 of a write operation, a logic flow 600 of a read operation, a logic flow 700 of a delete operation, and a logic flows 800, 900 of a flush operation, respectively. For these examples, these processes may be implemented by or use components or elements of system 100 shown in FIG. 1 such as system software 117, OS 111, circuitry 116, persistent memory 119, system memory device(s) 112, storage device 120, storage controller 124, memory 126, and/or storage memory device(s) 122. However, this process is not limited to being implemented by or use only these components or elements of system 100. Logic flow 500 may be representative of some or all of the operations executed by one or more logic, features, or devices described herein, such as apparatus 400. More particularly, in an embodiment logic flow 500 may be implemented by write component 422-1, logic flow 600 may be implemented by read component 422-2, logic flow 700 may be implemented by delete component 422-3, and logic flow 800 may be implemented by flush operation 422-4.

Figure 5:
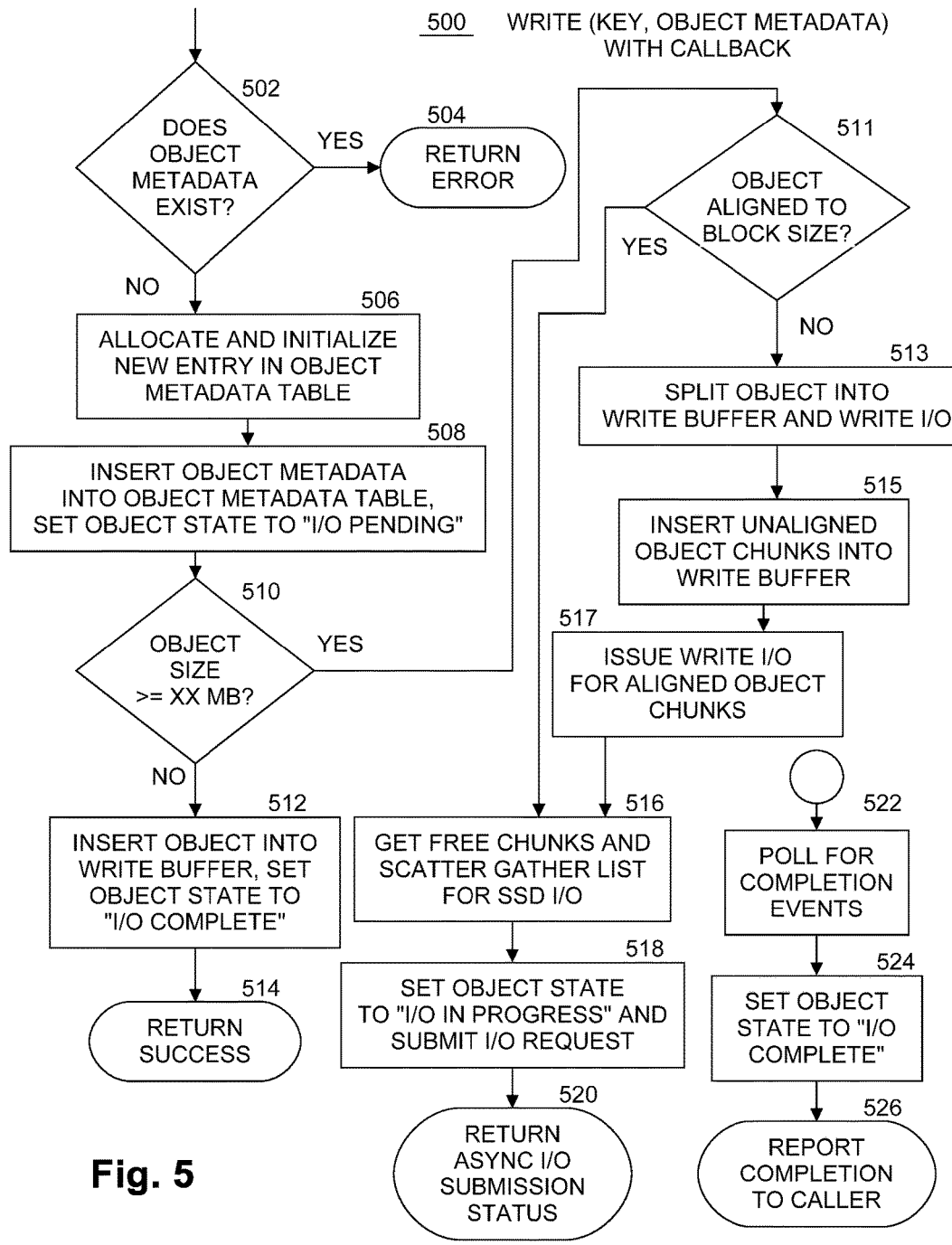
FIG. 5 illustrates an example of a logic flow of a write operation.

FIG. 5 illustrates an example of a logic flow of a write operation. Write component 422-1 may receive a write request as an I/O request 405 to perform a write operation. In an embodiment, the write request may comprise a key of the object to be written, object metadata, and callback information. At block 502, write component determines if the object identified by the key already has an entry in object metadata table 202. If the object already has an entry in object metadata table 202, a new object metadata entry need not be created and an error may be returned at block 504. If the object does not already have an entry in object metadata table 202, at block 506 write component allocates and initializes an entry in object metadata table 202 for the object identified by the received key. At block 508, write component inserts the object's metadata specified by the value parameter into the newly created entry in object metadata table 202, and sets the object state to I/O pending. At block 510, if the size of the object to be written is smaller than a defined amount (denoted XX megabytes (MB) in FIG. 5), then the object may be stored in a free entry in write buffer 206 at block 512, and the object state may be set to I/O complete. That is, smaller objects (e.g., objects smaller in size than the block size or smaller than XX MBs) may be temporarily stored in the write buffer 206 in persistent memory 119 on host computing platform 110 until an optimal time to write the object to storage memory device(s) 122. In one embodiment, the defined amount may be calculated using (<#of blocks>*<drive block size in KB>)/1024. The write buffer entry may be selected according to the size of the object (received as part of the object metadata) and the appropriate entry in bin 210 corresponding to the object size. A success indicator may be returned at block 514.

If at block 510 the size of the object to be written is greater than or equal to a defined amount (denoted XX megabytes (MB) in FIG. 5), then the object may be written to SSD memory 208. That is, larger objects may be stored immediately in storage memory device(s) 122 and not temporarily stored in persistent memory 119. At block 511, if the object is not aligned to a block size of the SSD, then the object may be split at block 513 into a portion to be written to write buffer 206 and a portion to be written to SSD memory 208 using SSD write I/O operations. At block 515, unaligned object chunks may be written into write buffer 206, and the location of the object may be updated in object metadata table 202. At block 517, write I/O operations may be issued for aligned object chunks. Processing continues with block 516. If at block 511 the object is aligned to a block size of the SSD, then processing continues with block 516. At block 516, write component 422-1 searches free chunk data structure 300 to identify free chunks to store the object, and gets a Scatter Gather List (SGL) for use in a SSD I/O operation. Entries in the SGL point to memory regions (either in persistent memory 119 or system memory device(s) 112) that storage device 120 (e.g., an SSD) may need to read data from or write data to. In an embodiment, system software 117 may communicate to storage device driver 115 (e.g., a NVMe driver) using the SGL.

At block 518, the state of the object may be set to "I/O in progress" and the sequential I/O request to write the object to SSD memory 208 may be submitted. At block 520, an asynchronous I/O submission status may be returned to the caller. Write component 422-1 may then poll for completion events at block 522. A completion event may indicate an error or a success for an I/O request by the SSD. If success, the SSD has written the object to SSD memory 208. When a completion event for the requested sequential I/O for the object is received, the state of the object in the object's entry in object metadata table 202 may be set at block 524 to "I/O complete" with an indication of whether the requested sequential I/O completed with an error or successfully, and the location of the object in object metadata able 202 may be updated. Write component 422-1 then responds at block 526 to the caller to report completion of the write request.

Figure 6:
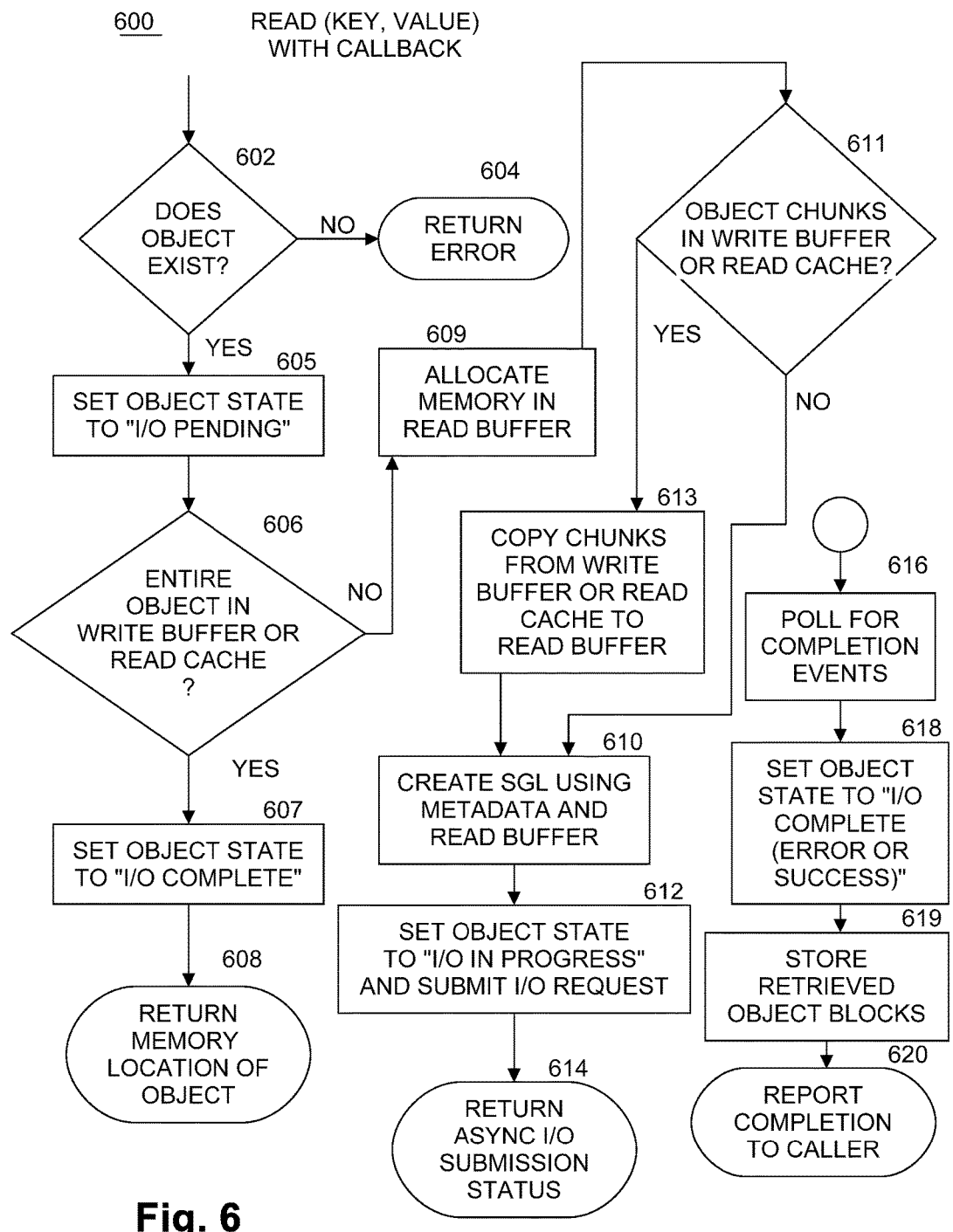
FIG. 6 illustrates an example of a logic flow of a read operation.

FIG. 6 illustrates an example of a logic flow of a read operation. Read component 422-2 may receive a read request as an I/O request 405 to perform a read operation. In an embodiment, the read request may comprise a key of the object to be read, object metadata, and callback information. At block 602, read component determines if the object identified by the key has an entry in object metadata table 202 (that is, the object has previously been stored in the system). If the object does not have an entry in object metadata table 202, an attempt to read an object that does not exist has been made, so an error may be returned at block 604. If the object does have an entry in object metadata table 202, at block 605 read component sets the object state to "I/O pending" and at block 606 read component determines if the entire object is in write buffer 206 or in read cache 204. If the entire object is in either write buffer 206 or read cache 204, then there is no need for an I/O operation to SSD memory 208. Instead, at block 607 the object state may be set to "I/O complete" and the memory location of the object in either write buffer 206 or read cache 204 may be returned to the caller along with a success indication at block 608. In an embodiment, if the object is in both the read cache and the write buffer, the read component returns the memory location of the object in the read cache, since access to the read cache is faster than the write buffer. If the object is only in the write buffer and not the read cache, the read component returns the memory location of the object in the write buffer.

At block 609, read component 422-2 allocates memory in read buffer 207. At block 611, read component checks if object chunks are in write buffer 206 or read cache 204. If object chunks are in write buffer 206 or read cache 204 then read component copies the object chunks from write buffer 206 or read cache 204 into read buffer 207. At block 610, read component 422-2 creates a Scatter Gather List (SGL) entry using the object's metadata from object metadata table 202, and the read buffer, for use in the read SSD I/O operation, and updates object metadata table 202. Entries in the SGL point to memory regions (either in persistent memory 119 or system memory device(s) 112) that storage device 120 (e.g., an SSD) may need to write data to. In an embodiment, system software 117 may communicate to storage device driver 115 (e.g., a NVMe driver) using the SGL.

At block 612, the state of the object may be set to "I/O in progress" and the sequential I/O request to read the object from SSD memory 208 may be submitted. At block 614, an asynchronous I/O submission status may be returned to the caller. Read component 422-2 may then poll for completion events at block 616. A completion event may indicate an error or a success for an I/O request by the SSD. If success, the SSD has read the object from SSD memory 208. When a completion event for the requested sequential I/O for the object is received, the state of the object in the object's entry in object metadata table 202 may be set at block 618 to "I/O complete" with an indication of whether the requested sequential I/O completed with an error or successfully. Read component 422-2 stores the retrieved blocks of the object in the read buffer at block 619. Read component 422-2 then responds at block 620 to the caller to report completion of the read request.

Figure 7:
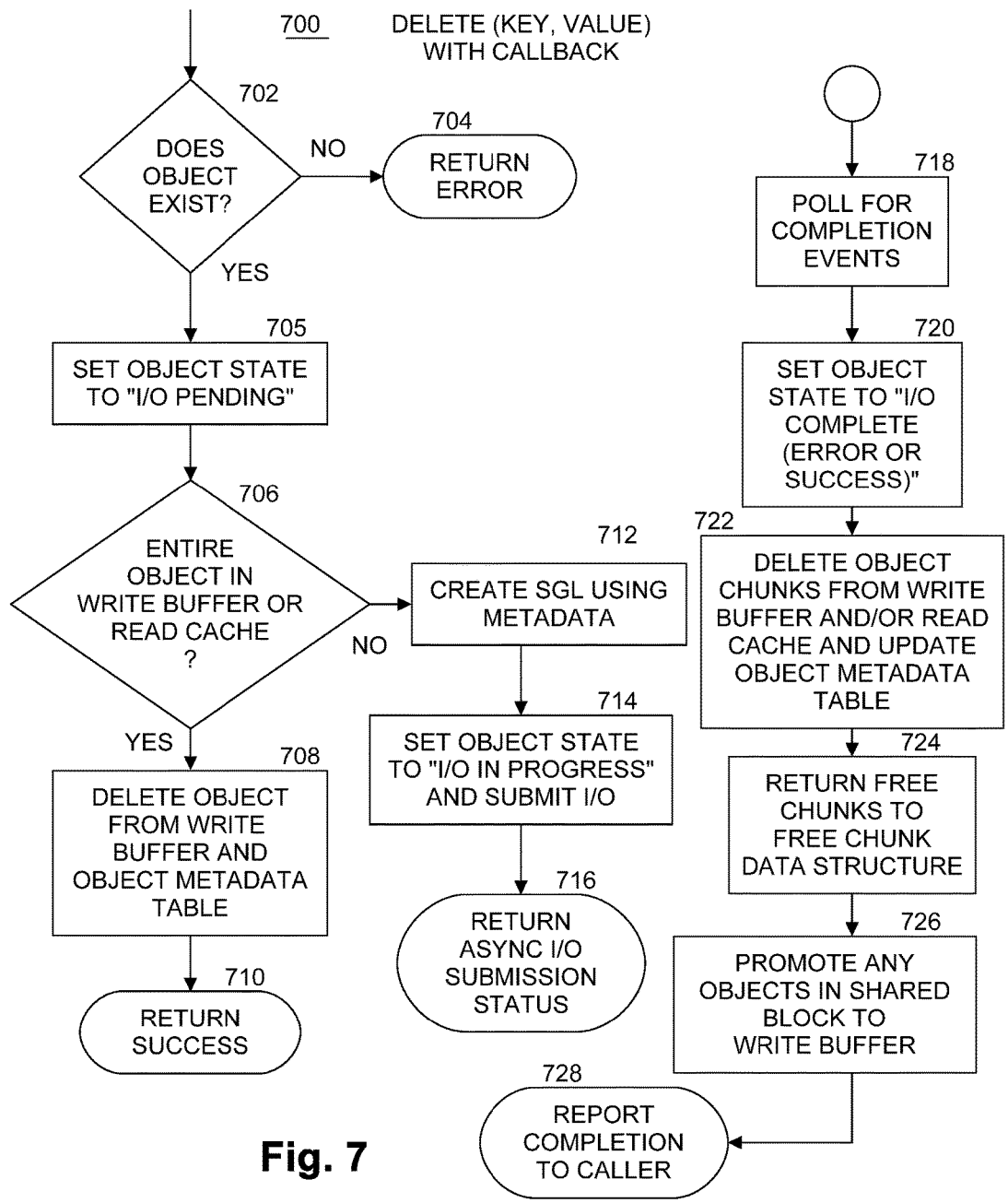
FIG. 7 illustrates an example of a logic flow of a delete operation.

FIG. 7 illustrates an example of a logic flow of a delete operation. Delete component 422-3 may receive a delete request as an I/O request 405 to perform a delete operation, thereby removing an object from system 200 (regardless of whether the object is stored in read cache 204, write buffer 206, or SSD memory 208). In an embodiment, the delete request may comprise a key of the object to be read, object metadata, and callback information. At block 702, read component determines if the object identified by the key has an entry in object metadata table 202 (that is, the object has previously been stored in the system). If the object does not have an entry in object metadata table 202, an attempt to delete an object that does not exist has been made, so an error may be returned at block 704. If the object does have an entry in object metadata table 202, at block 705 delete component sets the object state to "I/O pending". At block 706 delete component determines if the entire object is in write buffer 206 or in read cache 204. If the entire object is in either write buffer 206 or read cache 204, then there is no need for an I/O operation to SSD memory 208. Instead, the object may be deleted from write buffer 206 if the object is in the write buffer, and the object's entry in object metadata table 202 may be deleted at block 708. A success indication may be returned to the caller at block 710.

If the entire object is not in either write buffer 206 or read cache 204, then the object is in SSD memory 208. At block 712, delete component 422-3 creates a Scatter Gather List (SGL) entry using the object's metadata from object metadata table 202 for use in the read SSD I/O operation, and updates object metadata table 202. Entries in the SGL point to memory regions (either in persistent memory 119 or system memory device(s) 112) that storage device 120 (e.g., an SSD) may need to write data to. In an embodiment, system software 117 may communicate to storage device driver 115 (e.g., a NVMe driver) using the SGL. In a scenario where a block includes other objects, trim block operations to keep the other objects.

At block 714, the state of the object may be set to "I/O in progress" and the sequential I/O request to read the object from SSD memory 208 may be submitted. At block 716, an asynchronous I/O submission status may be returned to the caller. Delete component 422-3 may then poll for completion events at block 718. A completion event may indicate an error or a success for an I/O request by the SSD. If success, the SSD has read the object from SSD memory 208 and stored the object into read cache 204. When a completion event for the requested sequential I/O for the object is received, the state of the object in the object's entry in object metadata table 202 may be set at block 720 to "I/O complete" with an indication of whether the requested sequential I/O completed with an error or successfully. Delete component deletes object chunks, if any, from write buffer 206 and/or read cache 204 and the object's entry in object metadata table 202 may be deleted at block 722. Next, at block 724, delete component returns chunks freed by deleting the object to free chunk data structure 300 for future use in storing other objects. At block 726, delete component promotes any objects in a shared block to write buffer 206. Delete component 422-3 then responds at block 728 to the caller to report completion of the delete request.

Figure 8:
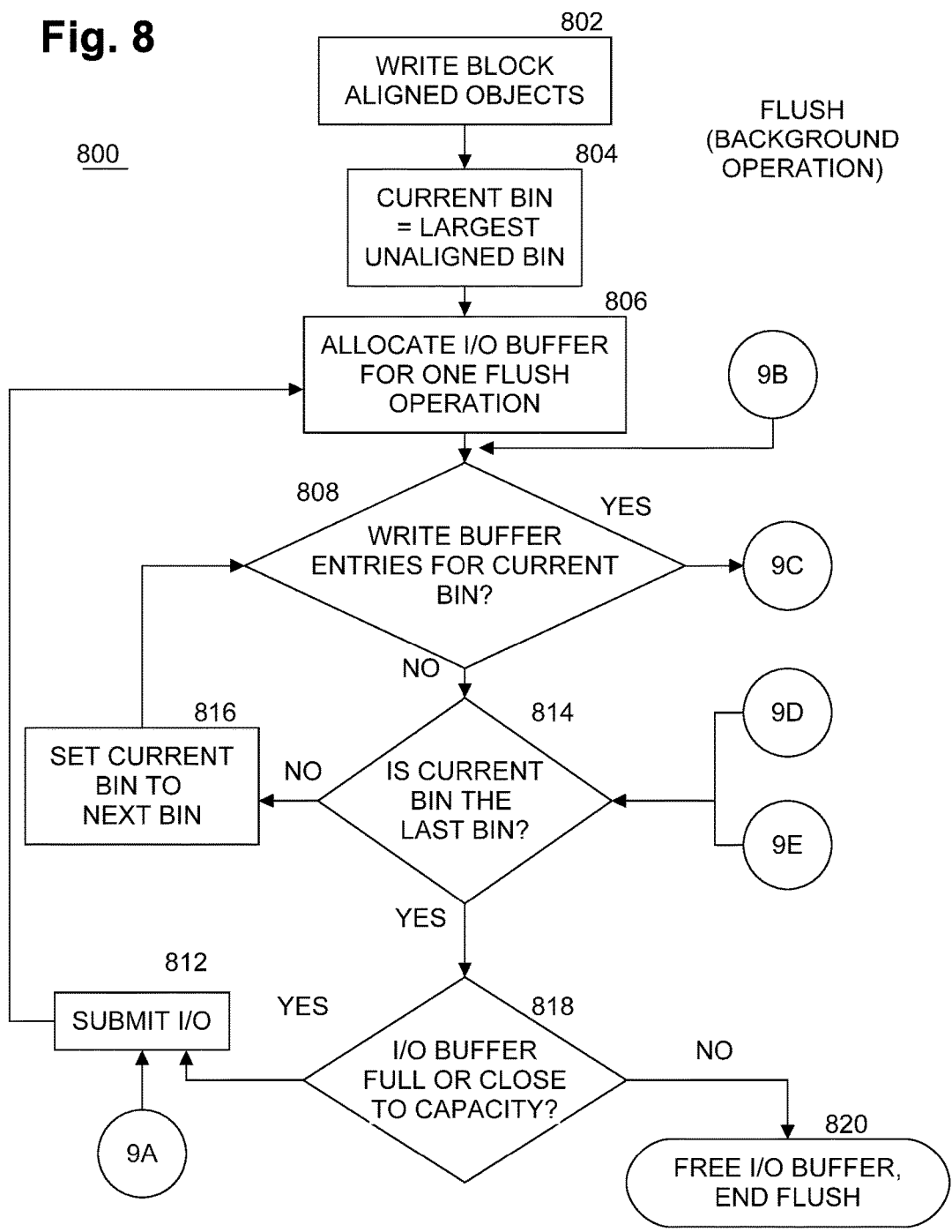
FIG. 8 and FIG. 9 illustrate an example of a logic flow of a flush operation.
Figure 9:
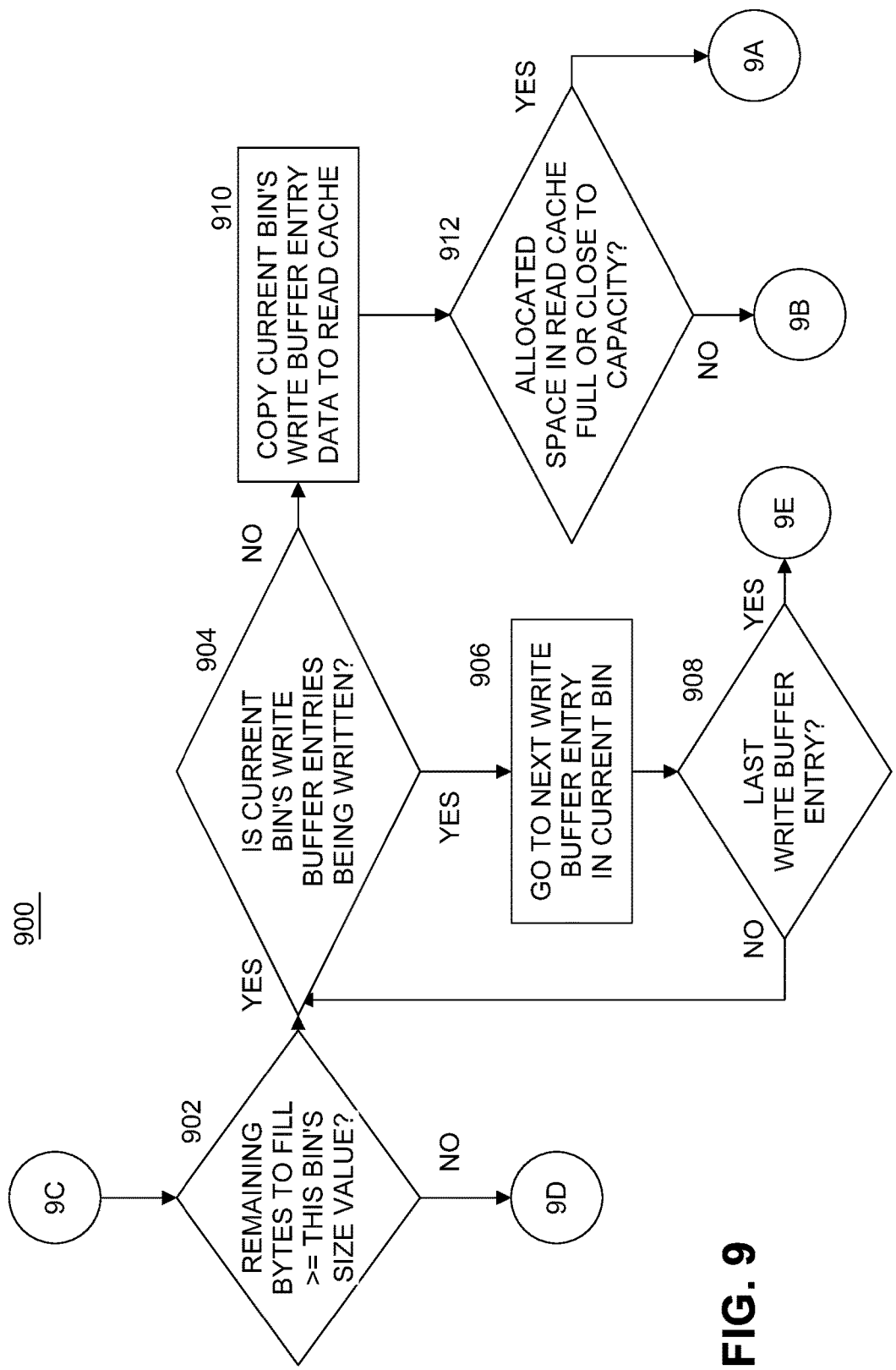

FIG. 8 and FIG. 9 illustrate an example of a logic flow of a flush operation. Flush component 422-4 may receive a flush request as an I/O request 405 to perform a flush operation, wherein objects stored in write buffer entries in system 200 may be coalesced with objects stored in other write buffer entries and then stored in the SSD as a block using sequential I/O bandwidth to improve system performance. In one embodiment, a flush request may be initiated by system software 117. As system 200 runs over time, fragmentation may develop in the write buffer. In an embodiment, a flush operation may be performed in the background when fragmentation in write buffer 206 may rise above a first defined threshold (e.g., more than a first specified percentage of the storage capacity of the write buffer). In an embodiment, flush operations may be performed until the fragmentation of the write buffer drops below a second defined threshold (e.g., less than a second specified percentage of the capacity of the write buffer). In an embodiment, flush component 422-4 analyzes write buffer entries to coalesce smaller objects into larger ones, and writes data to SSD memory when coalesced objects fill a block.

Flush processing begins at block 802, where flush component 422-4 writes block aligned objects to SSD memory 208 using a write request implemented by write component 422-1 as described above for FIG. 5. In an embodiment, block 802 accesses entries in write buffer 206 point to by aligned bin 212 of FIG. 2. At block 804, a variable for pointing to the current bin being processed (i.e., one of bins 210 of FIG. 2) during the compaction may be set to point to unaligned bin 214 in write buffer 206. At block 806, an I/O buffer may be allocated to temporarily store data for a write operation. In an embodiment, the size of the I/O buffer may be the number of block's worth of capacity to take advantage of drive sequential I/O bandwidth and fill the write operation completely or close to capacity before issuing a write operation.

Next, at block 808, flush component determines if there are any entries in write buffer 206 pointed to by the current bin. If so, processing continues via connector 9C with block 902 on FIG. 9. At block 902 of FIG. 9, flush component 422-4 determines if there are remaining bytes to fill a block in the write buffer that are greater than or equal to the current bin's size value. If not, processing continues via connector 9D to block 810 back on FIG. 8. If so, processing continues with block 904, where flush component determines if the current bin's write buffer entries are being written to read cache 204. If the current bin's write buffer entries are being written, then the flush component may go to the next write buffer entry for the current bin at block 906. If this is the last write buffer entry for the current bin, then processing continues via connect 9E at block 810 back on FIG. 8. If this is not the last write buffer entry for the current bin, processing continues with blocks 904 and 906 to handle additional write buffer entries for the current bin.

At block 904, if the current bin's writer buffer entries are not being written, then the current bin's write buffer entry may be copied to the read cache at block 910. The flush component next determines at block 912 if the allocated space (from block 806 of FIG. 8) is full or close to capacity, if so then processing continues via connector 9A with block 812 of FIG. 8. If the allocated space is not full or not close to capacity, then processing continues via connector 9B with block 808 on FIG. 8 to check for additional write buffer entries for the current bin.

Returning now to FIG. 8, at block 810 flush component determines if there are any entries in write buffer 206 pointed to by the current bin. If not, processing for this bin is complete, and processing may move to the next bin in bins 210. At block 814, flush component determines if the current bin is the last bin in bins 210 to be processed. If this is not the last bin, then the new current bin may be set to the next bin at block 816, and processing continues with write buffer entries pointed to by the new current bin at block 808. If this is the last bin in bins 210 to be processed, then flush component determines if the I/O buffer is full or close to capacity at block 818. If so, this data in the read cache may be written to SSD memory by submitting an I/O request at block 812. If the space allocated in the read cache is not full or not close to capacity, then processing may be completed by freeing unused read cache space and ending the flush operation at block 820.

Figure 10:
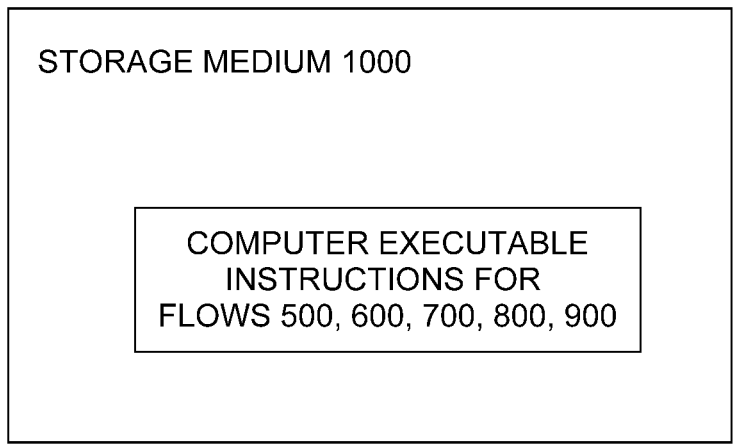
FIG. 10 illustrates an example storage medium.

FIG. 10 illustrates an example of a first storage medium. As shown in FIG. 10, the first storage medium includes a storage medium 1000. The storage medium 1000 may comprise an article of manufacture. In some examples, storage medium 1000 may include any non-transitory computer readable medium or machine readable medium, such as an optical, magnetic or semiconductor storage. Storage medium 1000 may store various types of computer executable instructions, such as instructions to implement logic flows 500, 600, 700, 800, and 900. Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

According to some examples, a component called circuitry 116 of FIG. 1 may execute processing operations or logic for apparatus 400 and/or storage medium 1000. Circuitry 116 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, ASIC, programmable logic devices (PLD), digital signal processors (DSP), FPGA/programmable logic, memory units, logic gates, registers, semiconductor device, chips, microchips, chip sets, and so forth. Examples of software elements may include software components, programs, applications, computer programs, application programs, device drivers, system programs, software development programs, machine programs, operating system software, middleware, firmware, software components, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

Host computing platform 110 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of host computing platform 110 described herein, may be included or omitted in various embodiments of host computing platform 110, as suitably desired.

The components and features of host computing platform 110 may be implemented using any combination of discrete circuitry, ASICs, logic gates and/or single chip architectures. Further, the features of host computing platform 110 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The follow examples pertain to additional examples of technologies disclosed herein.

Example 1

An example apparatus, coupled to a solid-state storage device (SSD) including a non-volatile memory to store an object, the SSD supporting input/output (I/O) operations of a block size, the apparatus comprising: a volatile memory including a cache to store the object; a persistent memory including a write buffer to store the object; and an object metadata component in the persistent memory to store attributes of stored objects, the attributes comprising at least an object identifier, an object state, and a location where the object is stored, the location being one or more of the cache, the write buffer, and the SSD; wherein objects smaller than the block size are stored in the write buffer until the smaller objects are coalesced with other smaller objects in the write buffer to implement a flush operation aligned to the block size to store the coalesced objects in the SSD.

Example 2

The apparatus of example 1, the cache having a faster access speed than the write buffer, and the write buffer having a faster access speed than the SSD.

Example 3

The apparatus of example 1, wherein the object state denotes pending I/O operations for the object.

Example 4

The apparatus of example 1, further comprising a write component to implement a write operation having the block size to store the object in the SSD when the object is larger than the block size, the write operation using sequential I/O bandwidth.

Example 5

The apparatus of example 2, further comprising a read component to implement a read operation to get the object from the location where the object is stored, the location being one or more of the cache, the write buffer, and the SSD, in order of fastest access speed.

Example 6

The apparatus of example 1, further comprising a delete component to implement a delete operation to delete the object from the location where the object is stored, the location being one or more of the write buffer and the SSD.

Example 7

The apparatus of example 1, wherein the persistent memory comprises a three-dimensional cross-point memory.

Example 8

An example system comprising: a solid-state storage device (SSD) including a non-volatile memory to store an object, the SDD supporting input/output (I/O) operations of a block size; and a computing platform, coupled to the SSD, comprising a volatile memory including a cache to store the object; a persistent memory including a write buffer to store the object, an object metadata component to store attributes of stored objects, the attributes comprising at least an object identifier, an object state, and a location where the object is stored, the location being one or more of the cache, the write buffer, and the SSD; and a component to manage storage of the object, wherein objects smaller than the block size are stored in the write buffer until the smaller objects are coalesced with other smaller objects in the write buffer to form a flush operation aligned to the block size to store the coalesced objects in the SSD.

Example 9

The system of example 8, the cache having a faster access speed than the write buffer, and the write buffer having a faster access speed than the SSD.

Example 10

The system of example 8, wherein the object state denotes pending I/O operations for the object.

Example 11

The system of example 8, wherein when the object is larger than the block size, the component comprises a write component to implement a write operation having the block size to store the object in the SSD, the write operation using sequential I/O bandwidth.

Example 12

The system of example 9, wherein the component comprises a read component to implement a read operation to get the object from the location where the object is stored, the location being one or more of the cache, the write buffer, and the SSD, in order of fastest access speed.

Example 13

The system of example 8, wherein the component comprises a delete component to implement a delete operation to delete the object from the location where the object is stored, the location being one or more of the write buffer and the SSD.

Example 14

The system of example 8, wherein the persistent memory comprises a three-dimensional cross-point memory.

Example 15

A method comprising: storing an object in a non-volatile memory in a solid-state storage device (SSD), the SDD supporting input/output (I/O) operations of a block size, when a size of the object is greater than or equal to the block size; storing the object in a write buffer in a persistent memory in a computing platform when the size of the object is less than the block size; updating an object metadata component in the persistent memory to store attributes of stored objects, the attributes comprising at least an object identifier, an object state, and a location where the object is stored, the location being one or more of a cache in volatile memory, the write buffer, and the SSD; and performing a flush operation to coalesce objects smaller than the block size together in the write buffer and to store the coalesced objects in the SSD when a size of coalesced objects is equal to the block size.

Example 16

The method of example 15, further comprising getting the object from the location where the object is stored, the location being one or more of the cache, the write buffer, and the SSD, in order of fastest access speed.

Example 17

The method of example 15, further comprising deleting the object from the location where the object is stored, the location being one or more of the write buffer and the SSD.

Example 18

The method of example 15, wherein the persistent memory comprises a three-dimensional cross-point memory.

Example 19

The method of example 15, further comprising updating the object metadata component after storing the object, reading the object, deleting the object, or performing the flush operation.

Example 20

An example of at least one machine readable medium may include a plurality of instructions that in response to being executed by system at a storage device may cause the system to carry out a method according to any one of examples 15 to 19.

Example 21

An example apparatus may include means for performing the methods of any one of examples 15 to 19.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:
1. A system comprising:
  a solid-state storage device (SSD) including a non-volatile memory to store an object, the SDD supporting input/output (I/O) operations of a block size; and
  a computing platform, coupled to the SSD, comprising
    a volatile memory including a cache to store the object;
    a three-dimensional cross-point persistent memory including a write buffer to store the object,
    an object metadata component to store attributes of stored objects, the attributes comprising at least an object identifier, an object state, and a location where the object is stored, the location being one or more of the cache, the write buffer, and the SSD; and
    a component to manage storage of the object, wherein objects smaller than the block size are stored in the write buffer until the smaller objects are coalesced with other smaller objects in the write buffer to form a flush operation aligned to the block size to store the coalesced objects in the SSD.
2. The system of claim 1, the cache having a faster access speed than the write buffer, and the write buffer having a faster access speed than the SSD.
3. The system of claim 1, wherein the object state denotes pending I/O operations for the object.
4. The system of claim 1, wherein when the object is larger than the block size, the component comprises a write component to implement a write operation having the block size to store the object in the SSD, the write operation using sequential I/O bandwidth.
5. The system of claim 2, wherein the component comprises a read component to implement a read operation to get the object from the location where the object is stored, the location being one or more of the cache, the write buffer, and the SSD, in order of fastest access speed.
6. The system of claim 1, wherein the component comprises a delete component to implement a delete operation to delete the object from the location where the object is stored, the location being one or more of the write buffer and the SSD.
7. A computer system comprising:
  a volatile memory including a cache to store an object; and
  a three-dimensional cross-point persistent memory including
    a write buffer to store the object; and
    an object metadata component in the persistent memory to store attributes of stored objects, the attributes comprising at least an object identifier, an object state, and a location where the object is stored, the location being one or more of the cache, the write buffer, and a solid-state storage device (SSD) coupled to the computer system, the SSD supporting input/output (I/O) operations of a block size;
  wherein objects smaller than the block size are stored in the write buffer until the smaller objects are coalesced with other smaller objects in the write buffer to implement a flush operation aligned to the block size to store the coalesced objects in the SSD.

8. The computer system of claim 7, the cache having a faster access speed than the write buffer, and the write buffer having a faster access speed than the SSD.

9. The computer system of claim 7, wherein the object state denotes pending I/O operations for the object.

10. The computer system of claim 7, further comprising a write component to implement a write operation having the block size to store the object in the SSD when the object is larger than the block size, the write operation using sequential I/O bandwidth.

11. The computer system of claim 8, further comprising a read component to implement a read operation to get the object from the location where the object is stored, the location being one or more of the cache, the write buffer, and the SSD, in order of fastest access speed.

12. The computer system of claim 7, further comprising a delete component to implement a delete operation to delete the object from the location where the object is stored, the location being one or more of the write buffer and the SSD.

13. A method comprising:
    storing an object in a non-volatile memory in a solid-state storage device (SSD), the SDD supporting input/output (I/O) operations of a block size, when a size of the object is greater than or equal to the block size;
    storing the object in a write buffer in a three-dimensional cross-point persistent memory in a computing platform when the size of the object is less than the block size;
    updating an object metadata component in the three-dimensional cross-point persistent memory to store attributes of stored objects, the attributes comprising at least an object identifier, an object state, and a location where the object is stored, the location being one or more of a cache in volatile memory, the write buffer, and the SSD; and
    performing a flush operation to coalesce objects smaller than the block size together in the write buffer and to store the coalesced objects in the SSD when a size of coalesced objects is equal to the block size.

14. The method of claim 13, further comprising getting the object from the location where the object is stored, the location being one or more of the cache, the write buffer, and the SSD, in order of fastest access speed.

15. The method of claim 13, further comprising deleting the object from the location where the object is stored, the location being one or more of the write buffer and the SSD.

16. The method of claim 13, further comprising updating the object metadata component after storing the object, reading the object, deleting the object, or performing the flush operation.

17. At least one machine readable medium comprising a plurality of instructions that in response to being executed by a system at a computing platform cause the system to:
    store an object in a non-volatile memory in a solid-state storage device (SSD), the SDD supporting input/output (I/O) operations of a block size, when a size of the object is greater than or equal to the block size;
    store the object in a write buffer in a three-dimensional cross-point persistent memory in a computing platform when the size of the object is less than the block size;
    update an object metadata component in the three-dimensional cross-point persistent memory to store attributes of stored objects, the attributes comprising at least an object identifier, an object state, and a location where the object is stored, the location being one or more of a cache in volatile memory, the write buffer, and the SSD; and
    perform a flush operation to coalesce objects smaller than the block size together in the write buffer and to store the coalesced objects in the SSD when a size of coalesced objects is equal to the block size.

18. The at least one machine readable medium of claim 17, further comprising instructions to get the object from the location where the object is stored, the location being one or more of the cache, the write buffer, and the SSD, in order of fastest access speed.

19. The at least one machine readable medium of claim 17, further comprising instructions to delete the object from the location where the object is stored, the location being one or more of the write buffer and the SSD.

20. The at least one machine readable medium of claim 17, further comprising instructions to update the object metadata component after storing the object, reading the object, deleting the object, or performing the flush operation.

* * * * *